(12) United States Patent
Miyoshi et al.

(10) Patent No.: US 9,761,773 B2
(45) Date of Patent: Sep. 12, 2017

(54) LIGHT EMITTING DEVICE

(71) Applicant: NICHIA CORPORATION, Anan-shi, Tokushima (JP)

(72) Inventors: Tomonori Miyoshi, Tokushima (JP); Hiroshi Miyairi, Yokohama (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 15/185,736

(22) Filed: Jun. 17, 2016

(65) Prior Publication Data
US 2016/0372515 A1 Dec. 22, 2016

(30) Foreign Application Priority Data

Jun. 18, 2015 (JP) .................... 2015-123010
Apr. 18, 2016 (JP) .................... 2016-082834

(51) Int. Cl.
| | |
|---|---|
| H01L 27/00 | (2006.01) |
| H01L 33/00 | (2010.01) |
| H01L 33/60 | (2010.01) |
| H01L 25/075 | (2006.01) |
| H01L 33/50 | (2010.01) |
| F21S 8/10 | (2006.01) |

(Continued)

(52) U.S. Cl.
CPC .......... *H01L 33/60* (2013.01); *H01L 25/0753* (2013.01); *F21S 48/115* (2013.01); *F21S 48/1163* (2013.01); *H01L 27/153* (2013.01); *H01L 33/46* (2013.01); *H01L 33/50* (2013.01); *H01L 33/56* (2013.01)

(58) Field of Classification Search
CPC ..... H01L 27/156; H01L 27/153; H01L 33/60; H01L 33/50; H01L 25/0753; H01L 33/56; F21S 48/115; H21S 48/1163
See application file for complete search history.

(56) References Cited

U.S. PATENT DOCUMENTS

| | | | |
|---|---|---|---|
| 8,803,422 B2* | 8/2014 | Miyairi ............... | H01L 25/0753 313/512 |
| 2008/0062682 A1* | 3/2008 | Hoelen .................... | F21K 9/00 362/231 |

(Continued)

FOREIGN PATENT DOCUMENTS

| | | |
|---|---|---|
| JP | 2008-294224 A | 12/2008 |
| JP | 2009-134965 A | 6/2009 |

(Continued)

*Primary Examiner* — Nikolay Yushin
(74) *Attorney, Agent, or Firm* — Andrews Kurth Kenyon LLP

(57) ABSTRACT

A light emitting device is provided. The light emitting device includes a substrate and a plurality of light emitting elements. The light emitting elements are electrically connected on the substrate, each having a light emitting surface. A light-transmissive member is arranged on the light emitting elements and a light-reflective member covers a lateral surface of the light emitting elements and a lateral surface of the light-transmissive member. The plurality of light emitting elements include a plurality of first light emitting elements and a second light emitting element that has an area of the light emitting surface smaller than that of each of the first light emitting elements. The second light emitting element is arranged between the first light emitting elements.

16 Claims, 7 Drawing Sheets

(51) Int. Cl.
 *H01L 27/15* (2006.01)
 *H01L 33/46* (2010.01)
 *H01L 33/56* (2010.01)

(56) References Cited

U.S. PATENT DOCUMENTS

| | | |
|---|---|---|
| 2008/0290351 A1 | 11/2008 | Ajiki et al. |
| 2011/0235355 A1 | 9/2011 | Seko |
| 2013/0106276 A1* | 5/2013 | Miyairi ............... H01L 25/0753 313/498 |
| 2013/0328074 A1* | 12/2013 | Lowes .................... H01L 27/15 257/89 |
| 2013/0329440 A1 | 12/2013 | Tsutsumi et al. |
| 2014/0077237 A1 | 3/2014 | Ajiki et al. |
| 2015/0243854 A1 | 8/2015 | Inoue et al. |
| 2016/0144771 A1 | 5/2016 | Miyachi et al. |

FOREIGN PATENT DOCUMENTS

| | | |
|---|---|---|
| JP | 2011-134829 A | 7/2011 |
| JP | 2011-204376 A | 10/2011 |
| JP | 2012-169189 A | 9/2012 |
| JP | 2016-100252 A | 5/2016 |
| WO | 2014-091539 A1 | 6/2014 |

\* cited by examiner

LIGHT EMITTING DEVICE

CROSS-REFERENCE TO RELATED APPLICATIONS

The present application claims priority under 35 U.S.C. §119 to Japanese Patent Application No. 2015-123010, filed on Jun. 18, 2015, and Japanese Patent Application No. 2016-082834, filed on Apr. 18, 2016. The contents of these applications are incorporated herein by reference in their entireties.

BACKGROUND

The present invention relates to a light emitting device used for, for example, an automotive headlight.

In recent years, an automotive headlight which employs white-color LEDs has been in practical use. The headlight which employs white-color LEDs is expected to become more widespread in the future because of the advantages of its being small in size, weight and energy consumption. The automotive headlight is required to provide the brightest region called a hot zone in its light distribution pattern. For example, Japanese Unexamined Patent Application Publication No. 2012-169189 (JP'189) discloses an automotive light emitting device in which a large-size LED chip for providing the hot zone is arranged at the central portion of a substrate.

However, in the light emitting device disclosed in JP'189, circuitry controls the brightness of a plurality of light emitting elements. Therefore, a complicated control system may be required in order to obtain a desired light distribution pattern.

SUMMARY

A light emitting device according to one embodiment includes: a substrate; a plurality of light emitting elements connected in series on the substrate and each having a light emitting surface; a light-transmissive member arranged on the light emitting elements; and a light-reflective member covering a lateral surface of the light emitting elements and a lateral surface of the light-transmissive member, wherein the plurality of light emitting elements include a plurality of first light emitting elements and a second light emitting element that has area of the light emitting surface smaller than that of each of the first light emitting elements, and the second light emitting element is arranged between the first light emitting elements.

DETAILED DESCRIPTION

Figure 1:
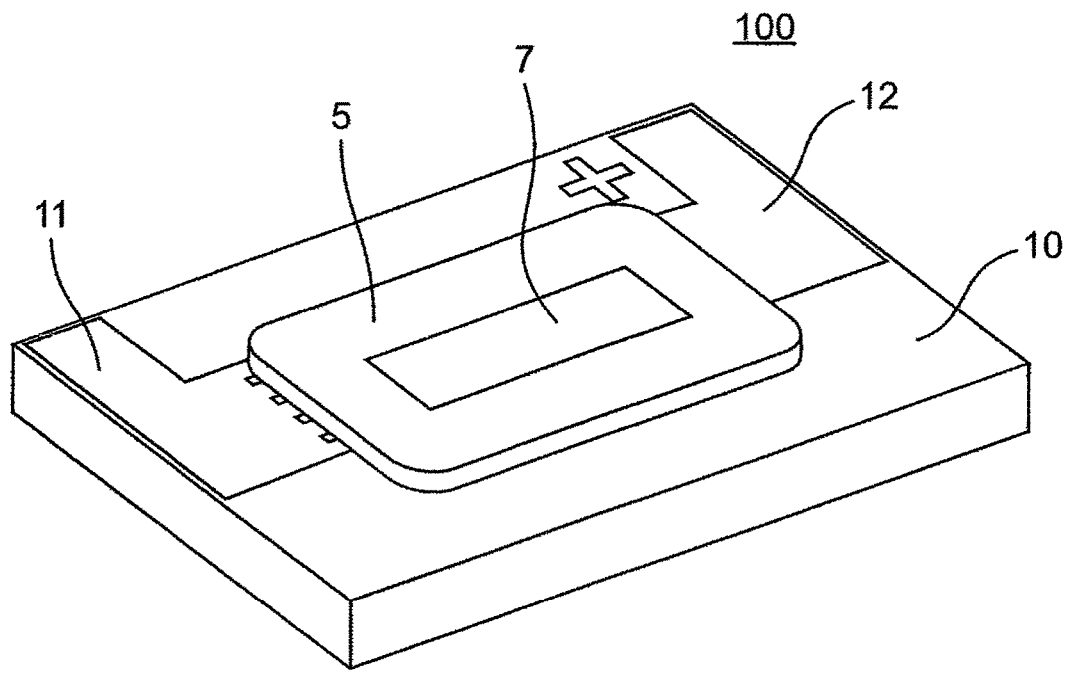
FIG. 1 is a schematic perspective view showing the structure of a light emitting device according to a first embodiment of the present invention.

In the following, a detailed description will be given of embodiments of the present invention with reference to the drawings. In the following description, terms representing specific directions or positions (for example, "upper", "lower", "right", "left" and other terms including those terms) are used as necessary. These terms are used for facilitating understanding of the invention with reference to the drawings, and the technical scope of the present invention is not limited by the meaning of the terms. Further, like reference numerals appearing in a plurality of drawings denote like portions or members.

First Embodiment

Figure 2:
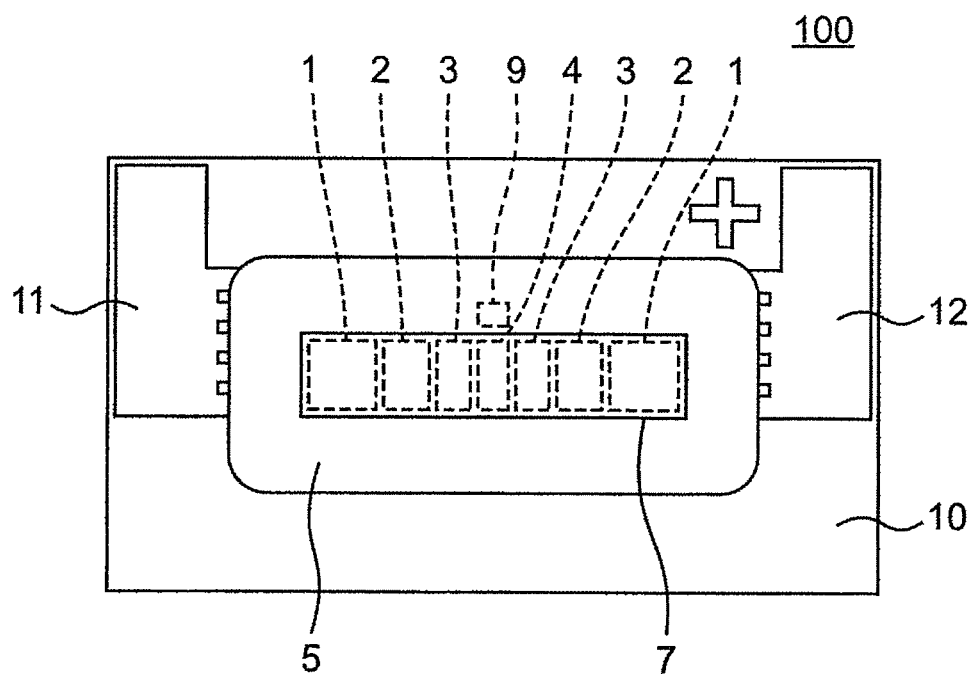
FIG. 2 is a schematic plan view showing the structure of the light emitting device according to the first embodiment.

As shown in FIG. 1, a light emitting device 100 according to a first embodiment of the present invention includes a substrate 10, a light-transmissive member 7, and a light-reflective member 5 covering the side surfaces of the light-transmissive member 7. The upper surface of the light-transmissive member 7 is exposed outside the light-reflective member 5, to form a light emitting surface of the light emitting device 100. For instance, the light-transmissive member 7 can have at least a portion of an external surface located over the light-reflective member 5. In the light emitting devices according to certain embodiments of the present invention, the light-transmissive member 7 may contain a fluorescent material that converts the wavelength of at least part of light emitted from the light emitting elements 1 and others. This may provide a light emitting device that emits, for example, white-color light using a light emitting element that emits blue-color light. The substrate 10 has, at its upper surface, a first electrode 11 and a second electrode 12. Portions of the first electrode 11 and the second electrode 12 exposed outside the light-reflective member 5 are connected to an external element, such as, for example, an external power supply circuit, thereby serving as the electrode terminals of the light emitting device 100. As shown in FIG. 2, the light emitting device 100 further includes a plurality of light emitting elements 1, 2, 3, and 4 provided on the substrate 10, and the light-transmissive member 7 is provided on the plurality of light emitting elements 1, 2, 3, and 4. The light-reflective member 5 covers the side surfaces of the light emitting elements 1, 2, 3, and 4 and the light-transmissive member 7. The light emitting device 100 may further include a protective element 9, such as, for example, one or more Zener diodes, as necessary. For instance, any suitable number and/or arrangement of protective elements 9 may be used in accordance with certain embodiment of the present invention.

In the light emitting device 100 according to the first embodiment, the light emitting elements 1, 2, 3, and 4 differ from one another in the area of their respective light emitting surfaces. Each light emitting element 2 has area of the light emitting surface smaller than that of each light emitting element 1. Each light emitting element 3 has area of the light emitting surface smaller than that of each light emitting element 2. The light emitting element 4 has area of the light emitting surface smaller than that of each light emitting element 3.

In the light emitting device 100 according to the first embodiment, the substrate 10 has, at its upper surface, the first electrode 11 and the second electrode 12, and the plurality of light emitting elements 1, 2, 3, and 4 are connected in series between the first electrode 11 and the second electrode 12. Further, in the light emitting device 100 according to the first embodiment, the light emitting elements 1, 2, 3, and 4 are aligned in one direction. The light emitting elements 2, 3, and 4 having area of the light emitting surface smaller than that of each light emitting element 1 are arranged between two light emitting elements 1. The light emitting elements 3 and 4 having area of the light emitting surface smaller than that of each light emitting element 2 are arranged between two light emitting elements 2. The light emitting element 4 having area of the light emitting surface further smaller than that of each light emitting element 3 is arranged between two light emitting elements 3.

In the light emitting device 100 according to the first embodiment, the shapes in a plan view (i.e., planarly-viewed shapes) of the light emitting elements 1, 2, 3, and 4 are substantially identical in the length of the sides being perpendicular to the direction in which the light emitting elements are aligned. That is, in the light emitting device 100 according to the first embodiment, the plurality of light emitting elements 1, 2, 3, and 4 are collectively arranged to form any desired shape, including a quadrangle, for example, in a plan view. The light emitting elements 1, 2, 3, and 4 can have one or more light emitting elements arranged in contact with one another and/or arranged so as to have spaces in-between one or more light emitting elements.

In the present specification, the arrangement means the positional relationship, and does not mean the electrical connection. That is, the plurality of light emitting elements 1, 2, 3, and 4 can be connected in series, and the connection order can be arbitrarily selected. Accordingly, for example, even when the light emitting elements 1 are arranged nearest to the first electrode 11 and the second electrode 12 as shown in FIG. 2, the light emitting elements 1 may be electrically connected, for example, between the light emitting elements 2 or between the light emitting elements 3, or between the light emitting elements 2 and the light emitting elements 3. In the present specification, "to connect" simply means "to electrically connect" unless otherwise specified.

With the light emitting device 100 according to the first embodiment structured as described above, since the light emitting elements 1, 2, 3, and 4 are connected in series, as the area of the light emitting surface is smaller, each light emitting element 2 has a current density higher than that of each light emitting element 1, each light emitting element 3 has a current density higher than that of each light emitting element 2, and the light emitting element 4 has a current density higher than that of each light emitting element 3. That is, the light emitting elements arranged nearer to the central portion have higher luminance. This implements the light emitting device having a hot zone at the central portion of the light distribution pattern.

Further, when the above-described light emitting device is used as the light source of an automotive headlight, the hot zone can be formed within the light emitting region without resorting to any complicated optical design. Therefore, the headlight can be reduced in size. Additionally, this reduction in size of the light source improves the designability of the headlight.

Second Embodiment

Next, with reference to FIG. 3, a description will be given of a light emitting device 200 according to a second embodiment of the present invention.

The light emitting device 200 according to the second embodiment is the same as the light emitting device 100 according to the first embodiment in that a plurality of light emitting elements 1, 2a, and 3a are connected in series. On the other hand, as shown in FIG. 3, the light emitting device 200 according to the second embodiment is different from the light emitting device 100 according to the first embodiment, in which a plurality of light emitting elements 1, 2, 3, and 4 are aligned in one direction. The difference is that a plurality of light emitting elements 2a and 3a each having area of the light emitting surface smaller than that of each light emitting element 1 are at least partially arranged in the direction crossing the line connecting between the centers of the light emitting elements 1. In the light emitting device 200 according to the second embodiment, the area of the light emitting surface of each light emitting element 2a is smaller than that of each light emitting element 1, and is substantially half the area of the light emitting surface of each light emitting element 1. The area of the light emitting surface of each light emitting element 3a is further smaller than that of each light emitting element 2a, and is substantially half the area of the light emitting surface of each light emitting element 2a. In the light emitting device 200 according to the second embodiment, the substrate 10, the light-transmissive member 7, and the light-reflective member 5 are structured similarly to those of the light emitting device 100 according to the first embodiment.

Further, in the light emitting device 200 according to the second embodiment, the light emitting elements 2a and the light emitting elements 3a are arranged between the light emitting elements 1 more densely than the light emitting elements 1. The light emitting elements 3a are arranged between the light emitting elements 2a more densely than the light emitting elements 2a. In this manner, by arranging the light emitting elements so that ones with smaller light emitting surface areas which are connected in series with ones with greater light emitting surface areas, are at the central portion. and additionally increasing the arrangement density of the light emitting elements with smaller light emitting surface areas, the light distribution characteristic exhibiting higher luminance at the central portion can be attained.

Further, in the light emitting device 200 according to the second embodiment, a plurality of light emitting elements 2a or light emitting elements 3a are arranged in a region which is identical in shape and size to a region where one light emitting element 1 is arranged. In other words, a plurality of light emitting elements 2a or light emitting elements 3a are arranged so as to form a shape which is substantially identical to the shape of the light emitting element 1 in a plan view. More specifically, the upper surface of the light emitting element 1 on the light emitting surface side is square. The upper surface of the light emitting element 2a on the light emitting surface side is quadrangular, in which the long side is equal to the length of one side of the light emitting element 1, and the short side is about half the side of the light emitting element 1. Two light emitting elements 2a are arranged, for example as shown in FIG. 3, in the direction perpendicular to the line connecting between the centers of the opposite light emitting elements 1. The upper surface of the light emitting element 3a on the light emitting surface side is square in which one side is about half the side of the light emitting element 1. Four light emitting elements 3a are arranged in a manner as if the light emitting element 1 is divided into quarters. That is, the light emitting elements 3a are arranged by two pieces in the direction connecting between the centers of the opposite light emitting elements 1 and in the direction perpendicular thereto. In this manner, for example, as shown in FIG. 3, when the light emitting surface of each light emitting element 2a has half the area of the light emitting surface of each light emitting element 1, the light emitting elements 2a have twice the arrangement density of the light emitting elements 1. For example, when the light emitting surface of each light emitting element 3a has half the area of the light emitting surface of each light emitting element 2a, the light emitting elements 3a have twice the arrangement density of the light emitting elements 2a.

Figure 3:
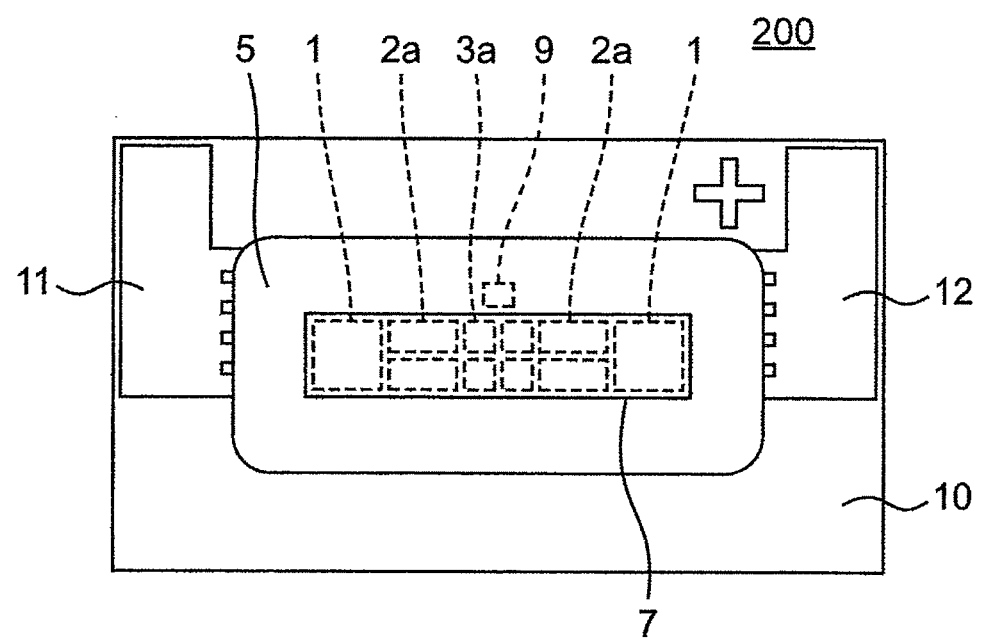
FIG. 3 is a schematic plan view showing the structure of a light emitting device according to a second embodiment of the present invention.

In FIG. 3, the light emitting surface of each light emitting element 2a exemplarily has half the area of the light emitting surface of each light emitting element 1, and the light emitting surface of each light emitting element 3a exemplarily has half the area of the light emitting surface of each light emitting element 2a. However, the light emitting elements according to the second embodiment may be arranged such that, for example: the light emitting surface of each light emitting element 2a has (1/n) times the area of the light emitting surface of each light emitting element 1 (where n is an integer of 2 or greater) and the light emitting elements 2a have n times the arrangement density of the light emitting elements 1; and the light emitting surface of each light emitting element 3a has (1/m) times the area of the light emitting surface of each light emitting element 1 (where m is an integer of 3 or greater) and the light emitting elements 3a have m times the arrangement density of the light emitting elements 1. This facilitates the arrangement of the light emitting elements.

The light emitting device 200 according to the second embodiment structured as described above makes it possible to arrange the light emitting elements 2a and 3a each having area of the light emitting surface smaller than that of the light emitting element 3 according to the first embodiment at higher density. For example, as shown in FIG. 3, a plurality of light emitting elements 3a can be arranged in longitudinal and lateral directions at higher density. Thus, the light distribution characteristic exhibiting higher brightness at the central portion is attained.

In the light emitting devices according to the first and second embodiments, a plurality of light emitting elements are arranged to form a quadrangular shape as a whole in a plan view, and the light-transmissive member 7 that collectively covers the whole plurality of light emitting elements also has a quadrangular shape.

However, the light emitting devices according to the embodiments are not limited thereto.

Third Embodiment

Next, with reference to FIG. 4, a description will be given of a light emitting device 300 according to a third embodiment of the present invention.

The light emitting device 300 according to the third embodiment includes light emitting elements 1, light emitting elements 2b each having area of the light emitting surface smaller than that of each light emitting element 1, and a light emitting element 3b having area of the light emitting surface smaller than each light emitting element 2b.

The light emitting device 300 is different from the light emitting device 100 according to the first embodiment in the following points.

Firstly, the light emitting device 300 is different from the light emitting device 100 according to the first embodiment in that the shapes in a plan view (i.e., planarly-viewed shapes) of the light emitting elements 1, the light emitting elements 2b and the light emitting element 3b are similar figures, that is, they are identical in the shape and different in the area. In the light emitting device 300 according to the third embodiment, the light emitting elements 1, 2b, and 3b are aligned in one direction. In the third embodiment, in order to facilitate a design of the optical system including the lens shape, the light emitting elements 1, 2b, and 3b are preferably arranged such that the centers of the light emitting elements 1, the centers of the light emitting elements 2b, and the center of the light emitting element 3b are positioned on a straight line, and to be line-symmetric relative to the straight line and also relative to a line being perpendicular to the straight line and passing through the center of the light emitting element 3b. The third embodiment, however, is not limited to such an arrangement, and various arrangements are possible so as to meet any required characteristics. For example, the light emitting elements 1, 2b, and 3b may be arranged such that one side of each light emitting element 1, one side of each light emitting element 2b, and one side of the light emitting element 3b are positioned on a straight line. The shapes of a plurality of light emitting elements included in the light emitting device 300 according to the third embodiment are not limited to similar figures. The plurality of light emitting elements 1, 2b, and 3b may be different from one another in the ratio between the longitudinal length and the lateral length.

Figure 4:
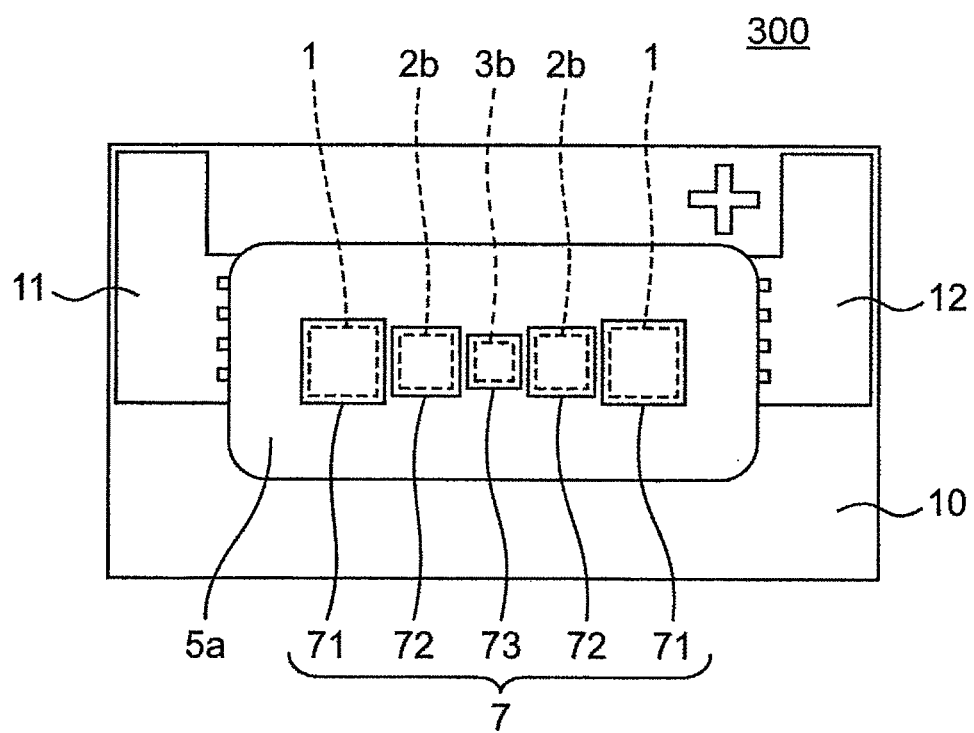
FIG. 4 is a schematic plan view showing the structure of a light emitting device according to a third embodiment of the present invention.

Further, as shown in FIG. 4, the light emitting device 300 according to the third embodiment is different from the light emitting device 100 according to the first embodiment in that the light emitting device 300 includes a light-transmissive member 7 which includes light-transmissive members 71 respectively covering opposite light emitting elements 1, light-transmissive members 72 respectively covering the light emitting elements 2b arranged on the inner side relative to the light emitting elements 1, and a light-transmissive member 73 covering the light emitting element 3b arranged between the light emitting elements 2b. In the light emitting device 300 according to the third embodiment, the planarly-viewed shapes of the light-transmissive members 71, 72, and 73 are identical or similar to the shapes of respective corresponding light emitting elements 1, 2b, and 3b.

Further, as shown in FIG. 4, the light emitting device 300 according to the third embodiment is different from the light emitting device 100 according to the first embodiment in that a light-reflective member 5a is provided to surround the light-transmissive members 71, the light-transmissive members 72, and the light-transmissive member 73 independently of each other.

As described above, the light emitting device 300 according to the third embodiment has the light-transmissive members 71, 72, and 73 respectively covering the light emitting elements 1, 2b, and 3b independently of one another, and the light-transmissive members 71, 72, and 73 are surrounded by the light-reflective member 5a.

Thus, light from light emitting elements 1, 2b, and 3b is efficiently output by virtue of the light-transmissive members 71, 72, and 73 surrounded by the light-reflective member 5a.

Fourth Embodiment

Figure 5:
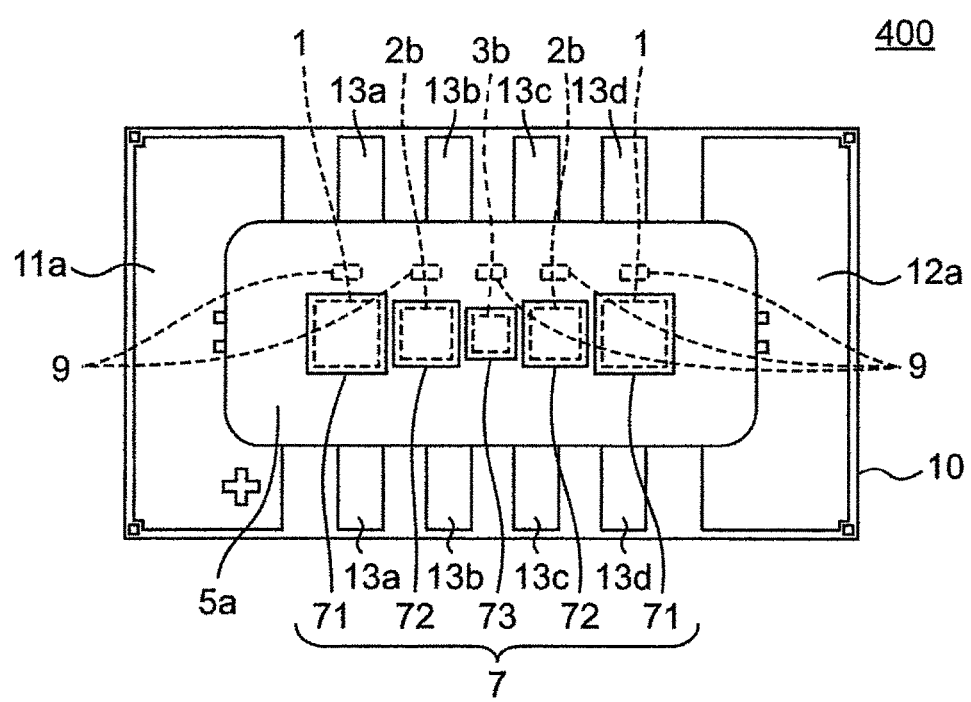
FIG. 5 is a schematic plan view showing the structure of a light emitting device according to a fourth embodiment of the present invention.

Next, with reference to FIG. 5, a description will be given of a light emitting device 400 according to a fourth embodiment of the present invention.

The light emitting device 400 according to the fourth embodiment is different from the light emitting device 300 according to the third embodiment in the structure of the electrodes formed at an upper surface of the substrate 10.

Specifically, in the light emitting device 400 according to the fourth embodiment, what are provided at the upper surface of the substrate 10 from one end toward the other end in the longitudinal direction are:

(a) a first electrode 11a;

(b) a connection electrode 13a electrically separated from the first electrode 11a;

(c) a connection electrode 13b electrically separated from the connection electrode 13a;

(d) a connection electrode 13c electrically separated from the connection electrode 13b;

(e) a connection electrode 13d electrically separated from the connection electrode 13c; and (f) a second electrode 12a electrically separated from the connection electrode 13d.

Here, the first electrode 11a is connectable to an external power supply circuit on one end in the longitudinal direction, and the second electrode 12a is connectable to the external power supply circuit on the other end in the longitudinal direction. Further, the connection electrode 13a, 13b, 13c, and 13d extend to almost reach the opposite longitudinal sides of the upper surface of the substrate 10, and are connectable to an external lighting control circuit at an outside the light-reflective member 5a.

At the upper surface of the substrate 10 provided with the electrodes in the foregoing manner, for example, a positive electrode of the light emitting element 1 arranged on the first electrode 11a side is connected to the first electrode 11a, and a negative electrode thereof is connected to the connection electrode 13a.

A positive electrode of the light emitting element 2b adjacent to the light emitting element 1 arranged on the first electrode 11a side is connected to the connection electrode 13a, and a negative electrode thereof is connected to the connection electrode 13b.

A positive electrode of the light emitting element 3b provided at the central portion is connected to the connection electrode 13b, and a negative electrode thereof is connected to the connection electrode 13c.

A positive electrode of the light emitting element 2b provided on the second electrode 12a side relative to the light emitting element 3b is connected to the connection electrode 13c, and a negative electrode thereof is connected to the connection electrode 13d.

A positive electrode of the light emitting element 1 arranged on the second electrode 12a side is connected to the connection electrode 13d, and a negative electrode thereof is connected to the second electrode 12a. As necessary, protective elements 9 are provided in parallel to the light emitting elements 1, 2b, and 3b.

In the light emitting device 400 according to the fourth embodiment structured as described above, a plurality of light emitting elements 1, 2b, and 3b differing from one another in the area of the light emitting surface are connected in series. Accordingly, each light emitting element 2b being smaller area of the light emitting surface than that of each light emitting element 1 can have higher current density than that of the light emitting element 1, and the light emitting element 3b being smaller area of the light emitting surface than that of each light emitting element 2b can have higher current density than that of the light emitting element 2b. Thus, the light emitting element being more centrally arranged and being smaller in the area of the light emitting surface can have higher luminance. This provides a light emitting device having the light distribution characteristic in which the central portion is bright, and for example, the brightness is reduced toward the opposite ends.

For example, the following structures are possible with the light emitting device 400 according to the fourth embodiment structured as described above:

when the first electrode 11a and the connection electrode 13a are connected to each other via, for example, any switch circuit or mechanism provided at an external lighting control circuit, the light emitting element 1 arranged on the first electrode 11a side can be turned off;

when the connection electrode 13a and the connection electrode 13b are connected to each other via, for example, any switch circuit or mechanism provided at an external lighting control circuit, the light emitting element 2b adjacent to the light emitting element 1 provided on the first electrode 11a side can be turned off;

when the connection electrode 13b and the connection electrode 13c are connected to each other via, for example, any switch circuit or mechanism provided at an external lighting control circuit, the light emitting element 3b provided at the central portion can be turned off;

when the connection electrode 13c and the connection electrode 13d are connected to each other via, for example, any switch circuit or mechanism provided at an external lighting control circuit, the light emitting element 2b provided on the second electrode 12a side relative to the light emitting element 3b can be turned off; and when the connection electrode 13d and the second electrode 12a are connected to each other via, for example, any switch circuit or mechanism provided at an external lighting control circuit, the light emitting element 1 arranged on the second electrode 12a side can be turned off.

In this manner, lighting control of the light emitting elements is enabled by providing the connection electrodes 13a to 13d connecting between adjacent light emitting elements to extend to the outside of the light-reflective member 5a.

Accordingly, with the light emitting device 400 according to the fourth embodiment, in addition to that the light distribution pattern having a hot zone can be formed at the central portion, the distributed light can be partially turned off under control of any external lighting control circuit.

Thus, for example, an automotive headlight equipped with the light emitting device 400 according to the fourth embodiment particularly used in high beams state can dim just the area of any oncoming car or pedestrian ahead, while being capable of having a hot zone in the light emitting region without resorting to complicated optical design.

Fifth Embodiment

Next, with reference to FIG. 6, a description will be given of a light emitting device 500 according to a fifth embodiment of the present invention.

The light emitting device 500 according to the fifth embodiment is different from the light emitting device 200 according to the second embodiment in the following points.

Figure 6:
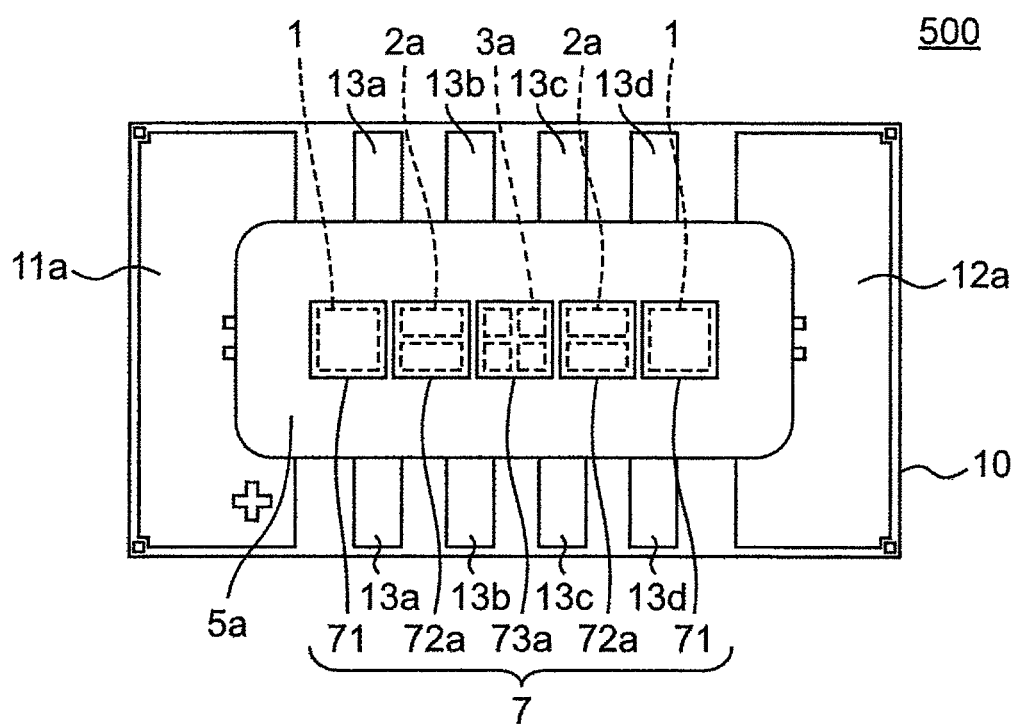
FIG. 6 is a schematic plan view showing the structure of a light emitting device according to a fifth embodiment of the present invention.

That is, as shown in FIG. 6, the light emitting device 500 according to the fifth embodiment is different from the light emitting device 200 according to the second embodiment in including a light-transmissive member 7 that includes light-transmissive members 71 respectively covering opposite light emitting elements 1, light-transmissive members 72a each covering two light emitting elements 2a, which are arranged on the inner side relative to the light emitting elements 1 and have each area of the light emitting surface smaller than that of each light emitting element 1, and light-transmissive member 73a covering four light emitting elements 3a, which are arranged between the light emitting elements 2a and have each area of the light emitting surface smaller than that of each light emitting element 2a.

Further, the light emitting device 500 according to the fifth embodiment is different from the light emitting device 200 according to the second embodiment in including the following electrodes at the upper surface of the substrate 10 from one end toward the other end in the longitudinal direction:

(a) a first electrode 11a;

(b) a connection electrode 13a electrically isolated from the first electrode 11a;

(c) a connection electrode 13b electrically isolated from the connection electrode 13a;

(d) a connection electrode 13c electrically isolated from the connection electrode 13b;

(e) a connection electrode 13d electrically isolated from the connection electrode 13c; and (f) a second electrode 12a electrically isolated from the connection electrode 13d.

Here, similarly to the fourth embodiment, the first electrode 11a is connectable to an external power supply circuit on one end side in the longitudinal direction, and the second electrode 12a is connectable to the external power supply circuit on the other side in the longitudinal direction. Further, the connection electrode 13a, the connection electrode 13b, the connection electrode 13c, and the connection electrode 13d extend to almost reach the opposite longitudinal sides of the upper surface of the substrate 10, and are connectable, outside the light-reflective member 5a, to an external lighting control circuit.

At the upper surface of the substrate 10 provided with the electrodes in the foregoing manner, for example, the positive electrode of the light emitting element 1 arranged on the first electrode 11a side is connected to the first electrode 11a, and the negative electrode thereof is connected to the connection electrode 13a.

Two light emitting elements 2a adjacent to the light emitting element 1 provided on the first electrode 11a side are connected in series between the connection electrode 13a and the connection electrode 13b. More specifically, the positive electrode of one of the two light emitting elements 2a is connected to the connection electrode 13a. The negative electrode of the one of the light emitting elements 2a and the positive electrode of the other one of the light emitting elements 2a are connected to each other. The negative electrode of the other one of the light emitting elements 2a is connected to the connection electrode 13b.

Four light emitting elements 3b provided at the central portion are connected in series between the connection electrode 13b and the connection electrode 13c. More specifically, the positive electrode of the first one of the four light emitting elements 3a is connected to the connection electrode 13b. The negative electrode of the first one of the light emitting elements 3a and the positive electrode of the second one of the light emitting elements 3a are connected to each other. The negative electrode of the second one of the light emitting elements 3a is connected to the positive electrode of the third one of the light emitting elements 3a. The negative electrode of the third one of the light emitting elements 3a is connected to the positive electrode of the fourth one of the light emitting elements 3a. The negative electrode of the fourth one of the light emitting elements 3a is connected to the connection electrode 13c.

Two light emitting elements 2a provided on the second electrode 12a side relative to the light emitting elements 3a are connected in series between the connection electrode 13c and the connection electrode 13d. More specifically, the positive electrode of one of the two light emitting elements 2a is connected to the connection electrode 13c. The negative electrode of the one of the light emitting elements 2a and the positive electrode of the other one of the light emitting elements 2a are connected to each other. The negative electrode of the other one of the light emitting elements 2a is connected to the connection electrode 13d.

The positive electrode of the light emitting element 1 arranged on the second electrode 12a side is connected to the connection electrode 13d, and the negative electrode thereof is connected to the second electrode 12a.

In the light emitting device 500 according to the fifth embodiment structured as described above, a plurality of light emitting elements 1, 2a, and 3a differing from one another in the area of the light emitting surface are connected in series. Accordingly, each light emitting element 2a being smaller area of the light emitting surface than that of each light emitting element 1 can have higher current density than that of the light emitting element 1, and each light emitting element 3a being smaller area of the light emitting surface than that of each light emitting element 2a can have higher current density than that of each light emitting element 2a. Thus, the light emitting element being more centrally arranged can have higher luminance. This provides a light emitting device having the light distribution characteristic in which the central portion is bright, and for example, the brightness is reduced toward the opposite ends and below.

For example, the following structures are possible with the light emitting device 500 according to the fifth embodiment structured as described above:

when the first electrode 11a and the connection electrode 13a are connected to each other via, for example, any switch circuit or mechanism provided at an external lighting control circuit, the light emitting element 1 arranged on the first electrode 11a side can be turned off;

when the connection electrode 13a and the connection electrode 13b are connected to each other via, for example, any switch circuit or mechanism provided at an external lighting control circuit, two light emitting elements 2a adjacent to the light emitting element 1 provided on the first electrode 11a side can be turned off;

when the connection electrode 13b and the connection electrode 13c are connected to each other via, for example, any switch circuit or mechanism provided at an external lighting control circuit, the four light emitting elements 3a provided at the central portion can be turned off;

when the connection electrode 13c and the connection electrode 13d are connected to each other via, for example, any switch circuit or mechanism provided at an external lighting control circuit, the two light emitting elements 2b provided on the second electrode 12a side relative to the light emitting elements 3b can be turned off;

and when the connection electrode 13d and the second electrode 12a are connected to each other via, for example, any switch circuit or mechanism provided at an external lighting control circuit, the light emitting element 1 provided on the second electrode 12a side can be turned off.

In this manner, lighting control of the light emitting elements is enabled by causing the connection electrodes 13a to 13d connecting between adjacent light emitting elements to extend to the outside of the light-reflective member 5a.

Accordingly, the light emitting device 500 according to the fifth embodiment can form the light distribution pattern having a hot zone at the central portion, and additionally partially turn off the distributed light under control of any external lighting control circuit.

Thus, for example, an automotive headlight equipped with the light emitting device 500 according to the fifth embodiment particularly used in high beams state can dim just the area of any oncoming car or pedestrian ahead, while being capable of having a hot zone in the light emitting region without resorting to complicated optical design.

Figure 7:
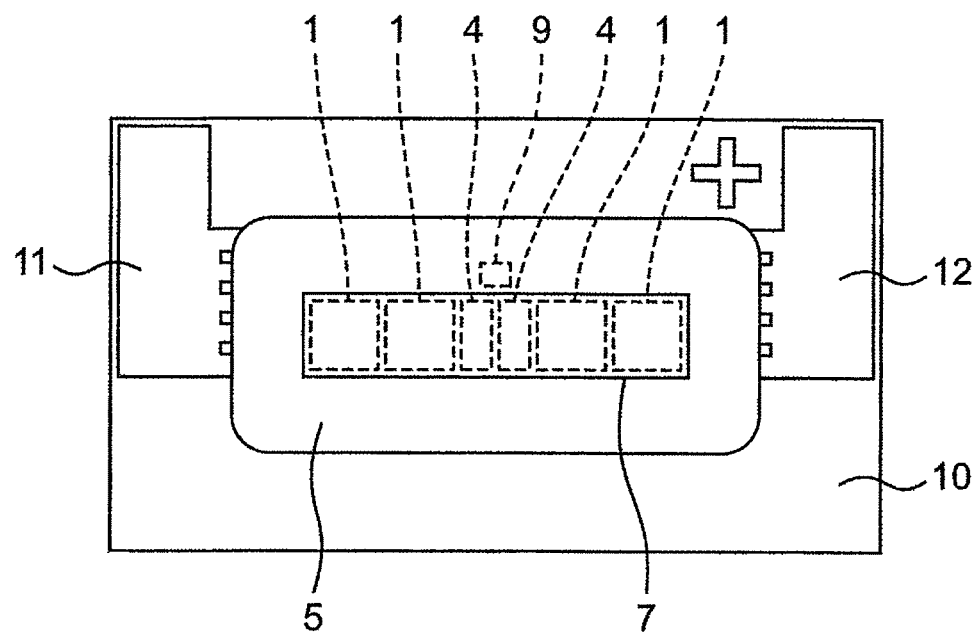
FIG. 7 is a schematic plan view showing the structure of a light emitting device according to an alternate example of the present invention.

While the foregoing light emitting devices according to the first to fifth embodiments exemplarily show the use of three or more types of light emitting elements differing from one another in the area of the light emitting surface, the embodiments are not limited thereto. As shown in FIG. 7, a light emitting device may be structured using two types of light emitting elements differing from each other in the area of the light emitting surface.

The light emitting device in FIG. 7 exemplarily shows the structure in which the light emitting elements 1, 2, 3, and 4 in the light emitting device 100 according to the first embodiment are replaced by four light emitting elements 1 and two light emitting elements 4. The two light emitting elements 4 are positioned at the central portion and have each area of the light emitting surface smaller than that of each light emitting element 1.

As stated herein above, in the light emitting devices according to certain embodiments of the present invention, the light-transmissive member 7 may contain a fluorescent material that converts the wavelength of at least part of light emitted from the light emitting elements 1 and others. This may provide a light emitting device that emits, for example, white-color light using a light emitting element that emits blue-color light.

With the above-described light emitting device according to each of first to fifth embodiments, a hot zone is formed in the light emitting region of the light emitting elements differing from one another in the area of the light emitting surface. Specifically, with the light emitting devices according to the first to fifth embodiments, the light emitting elements differing from one another in the area of the light emitting surface are connected in series and voltage is applied. Thus, the light emitting elements with smaller area of the light emitting surface can have higher current density and emit light at higher luminance, creating a hot zone. For example, in the light emitting device according to the third embodiment, using an LED chip having a side length (i.e., chip size) of 1.3 mm as the light emitting element 1, an LED chip having a side length of 1.15 mm as the light emitting element 2b, and an LED chip having a side length of 1 mm as the light emitting element 3b, a hot zone of desired intensities can be formed at desired positions in the illumination ranges of the light emitting elements. Table 1 shows exemplary relationship between the area of the light emitting surface and the luminance in this example.

TABLE 1

| Light emitting element | Chip size | Current (A) | Relative area ratio | Relative luminance |
|---|---|---|---|---|
| 1 | 1.30 mm | 1.00 A | 1.0 | 1.00 |
| 2b | 1.15 mm | 1.00 A | 0.8 | 1.11 |
| 3b | 1.00 mm | 1.00 A | 0.6 | 1.23 |

In the example shown in Table 1, the relative luminance substantially linearly changes in accordance with changes in the area ratio. In such a case, by appropriately setting the area ratio of the light emitting surface in order to attain the required light emission luminance, a hot zone (e.g., a zone of high luminance) of desired intensity can be formed at the desired position. However, in a case where the relative luminance does not linearly change in accordance with changes in the area ratio also, appropriate setting of the area ratio of the light emitting surface can form a hot zone of desired intensity at the desired position. That is, when the current density exceeds a certain value, the current-light conversion efficiency decreases (the droop phenomenon), and an increase rate of luminance relative to an increase rate of current density reduces. In such a case also, by appropriately setting the area ratio of the light emitting surface in order to attain the required light emission luminance while taking into consideration of a reduction in an increase rate of the luminance relative to an increase rate of the current density, a hot zone of desired intensity can be formed at the desired position.

As described above, the light emitting devices according to the first to fifth embodiments can also be structured using light emitting elements of which relative luminance does not linearly change in accordance with changes in the area ratio of the light emitting surface. However, the light emitting devices according to the first to fifth embodiments are preferably structured using light emitting elements with which the droop phenomenon is reduced, that is, light emitting elements in which a current density where the current-light conversion efficiency starts to reduce is raised. Thus, a hot zone of desired intensity can be easily formed at the desired position in the illumination range.

In the following, a description will be given of members and structures of the light emitting devices 100, 200, 300, 400, and 500 according to the embodiments.

Substrate 10

The substrate 10 may be composed of an insulating member such as glass epoxy, resin, or ceramic. Further, the substrate 10 may be composed of metal provided with an insulating member, or may be a metal member provided with an insulating member. In particular, in the light emitting device for an automotive headlight, the substrate 10 is preferably composed of ceramic, which is highly heat-resistant and weather-resistant. Preferable ceramic materials include alumina, aluminum nitride, and mullite.

First Electrode 11 and Second Electrode 12

A pair of positive and negative first electrode 11 and second electrode 12 is composed of a material which can be formed on the surface of the substrate 10 and can serve as the external terminals of the light emitting device. The material of the electrodes is not particularly limited so long as it exhibits excellent electrical conductivity and mountability. For example, metal such as copper, aluminum, gold, silver, platinum, titanium, tungsten, palladium, iron, or nickel or alloy containing such metal can be employed. Further, an electrically conductive member formed on the upper surface of a base member preferably has its outermost surface covered by a material exhibiting high reflectivity such as silver or gold, so that light from the semiconductor light emitting element placed thereon is efficiently extracted. Such first electrode 11 and second electrode 12 can be formed by electroplating, electroless plating, vapor deposition, sputtering or the like.

Light Emitting Elements 1, 2, 2a, 2b, 3, 3a, 3b, and 4

For the light emitting elements light emitting diodes can be preferably used. The light emitting elements may be of arbitrary wavelength. For example, the material of a blue, green-color light emitting element may be a ZnSe or nitride-based semiconductor ($In_XAl_YGa_{1-X-Y}N$, $0≤X$, $0≤Y$, $X+Y≤1$), or GaP. For a red light emitting element, GaAlAs, AlInGaP or other materials can be used. Further, semiconductor light emitting elements composed of other materials may be used. The composition, emission light color, size, number and the like of the light emitting elements may be selected as appropriate depending on the intended use. In case of the light emitting device packaged with a fluorescent material, a nitride semiconductor ($In_XAl_YGa_{1-X-Y}N$, $0≤X$, $0≤Y$, $X+Y≤1$) that can emit light of short wavelength capable of efficiently exciting the fluorescent material may be preferably used. Arbitrary light emitting wavelength may be selected depending on the material or mixed crystal ratio of the semiconductor layer.

Each of the light emitting elements according to the embodiments has a pair of positive and negative electrodes on the same surface side. The electrodes are respectively flip-chip mounted on the first electrode 11 and the second electrode 12 on the substrate via bumps. The upper surface opposite to the lower surface where the electrodes are formed is the main light output surface. Such a light emitting element is electrically connected to the first electrode 11 and the second electrode 12 using electrically conductive members such as bumps and electrically conductive paste. Therefore, as compared to a face-up light emitting element connected using metal wires or the like, the contact area with the first electrode 11 and the second electrode 12 can be increased and the contact resistance can be reduced.

The light emitting element is, for example, obtained by having a nitride semiconductor layer stacked on a light-transmissive sapphire substrate for crystal growth. The sapphire substrate is the upper surface of the light emitting element 3, and serves as the main light output surface. The growth substrate may be removed by, for example, polishing, LLO (i.e., Laser Lift Off) or other methods. Such a growth substrate is not limited to a sapphire substrate, and the material may be changed as appropriate.

Light-Transmissive Member 7

The light-transmissive member 7 is a material capable of transmitting at least a part of light having been emitted from the light emitting element to the outside, and may contain a light diffusing member or a fluorescent material that is capable of converting the wavelength of at least a part of the input light. Specifically, the light-transmissive member 7 may be, for example, a single crystal, polycrystalline fluorescent material or a cut piece of a fluorescent material ingot such as a sintered body of fluorescent material powder, or may be a sintered component of a mixture of fluorescent material powder and resin, glass, an inorganic material or the like. While the thickness of the light-transmissive member 7 is not particularly limited and can be changed as appropriate, an exemplary thickness is about 50 μm 300 μm.

Wavelength Conversion Member

The fluorescent material contained in the light-transmissive member 7 should be capable of being excited by light emitted from the light emitting element. For example, a fluorescent material that can be excited by a blue-color light emitting element or a ultraviolet light emitting element may be: a cerium-activated yttrium-aluminum-garnet-based fluorescent material (Ce:YAG); a cerium-activated lutetium-aluminum-garnet-based fluorescent material (Ce:LAG); an europium- and/or chromium-activated nitrogen-containing calcium aluminosilicate fluorescent material ($CaO$—$Al_2O_3$—$SiO_2$); an europium-activated silicate-based fluorescent material (($Sr,Ba)_2SiO_4$); a nitride-based fluorescent material such as a β-sialon fluorescent material, a CASN-based fluorescent material, and a SCASN-based fluorescent material; a KSF-based fluorescent material ($K_2SiF_6$:Mn); a sulfide-based fluorescent material, a quantum dot fluorescent material and the like. By combining the fluorescent materials and a blue-color light emitting element or an ultraviolet light emitting element, many colors and color temperatures can be realized. For example, in certain embodiments of the present invention, light emitting devices can be manufactured to emit light of various colors, including, for instance, white-color-based light.

Light-Reflective Member 5

The light-reflective member 5 covers the lateral surfaces of the light emitting element and those of the light-transmissive member 7. The light-reflective member 5 may be composed of a light-reflective material having good light reflectivity. In certain embodiments of the present invention, the light-reflective member may have 60% of or greater of reflectivity to light from the light emitting elements. In other embodiments of the present invention, the light reflective member may more preferably have 80% or 90% or greater of reflectivity to light from the light emitting elements. The light-reflective member 5 is, for example, composed of resin containing a light-reflective substance. The light-reflective member 5 is formed, for example, such that its upper surface has the same or slightly lower height than the upper surface of the light-transmissive member 7.

The resin being the base material composing the light-reflective member 5 may be silicone resin, modified silicone resin, epoxy resin, modified epoxy resin, acrylic resin, or hybrid resin that contains at least one of the foregoing resins. The light-reflective member 5 may be formed with such resin as a base material, and a reflective substance contained in the resin. The light-reflective substance may be an oxide containing any one of Ti, Zr, Nb, Al, and Si, or AN, MgF or the like. The light-reflective substance is preferably titanium dioxide ($TiO_2$). Further, preferably, particles being different in the refractive index from the base material resin are dispersed in the base material resin as the light-reflective substance. The reflected amount and transmitted amount of light vary depending on the content and concentration of the light-reflective substance. Therefore, the content and the concentration should be adjusted as appropriate depending on the shape or size of the light emitting device.

DENOTATION OF REFERENCE NUMERALS 1, 2, 2a, 2b, 3, 3a, 3b, 4: light emitting element
5: light-reflective member
7, 71, 72, 72a, 73, 73a: light-transmissive member
10: substrate
9: protective element
11, 11a: first electrode
12, 12a: second electrode
13a, 13b, 13c, 13d: connection electrode
100, 200, 300, 400, 500: light emitting device

What is claimed is:

1. A light emitting device comprising:
   a substrate;
   a plurality of light emitting elements connected in series on the substrate and each having a light emitting surface;
   a light-transmissive member arranged on the light emitting elements; and
   a light-reflective member covering a lateral surface of the light emitting elements and a lateral surface of the light-transmissive member, wherein
      the plurality of light emitting elements include a plurality of first light emitting elements and a second light emitting element that has smaller area of the light emitting surface than that of each of the first light emitting elements, and
      the second light emitting element is arranged between the first light emitting elements.

2. The light emitting device according to claim 1, wherein the second light emitting element is connected between the first light emitting elements.

3. The light emitting device according to claim 1, wherein the plurality of the second light emitting elements are arranged to form an overall shape that is substantially the same as a shape of the first light emitting element in a plan view.

4. The light emitting device according to claim 1, wherein the plurality of light emitting elements are collectively arranged to form a substantially quadrangular shape.

5. The light emitting device according to claim 1, wherein the light-transmissive member is arranged to wholly cover the plurality of light emitting elements.

6. The light emitting device according to claim 1, wherein the light-transmissive member contains a fluorescent material that is capable of converting a wavelength of at least part of light emitted from the light emitting elements.

7. The light emitting device according to claim 1, wherein
   the substrate includes an electrode connecting the light emitting elements to each other, and
   the electrode extends to an outside of the light-reflective member.

8. The light emitting device according to claim 1, wherein a current density of the second light emitting element is higher than that of each of the first light emitting elements.

9. The light emitting device according to claim 1, wherein a plurality of the second light emitting elements, each having an area of the light emitting surface smaller than that of each of the first light emitting elements, are connected in series between the first light emitting elements.

10. The light emitting device according to claim 9, wherein the plurality of light emitting elements are aligned in one direction.

11. The light emitting device according to claim 9, wherein the plurality of the second light emitting elements are at least partially arranged in a direction crossing a line connecting respective centers of the first light emitting elements.

12. The light emitting device according to claim 1, wherein
   the plurality of light emitting elements further includes a third light emitting element having an area of the light emitting surface smaller than that of each of the first light emitting elements and having the area of the light emitting surface greater than that of each of the second light emitting elements, and
   the third light emitting element is connected in series with the second light emitting elements between the first light emitting elements.

13. The light emitting device according to claim 12, wherein the light-transmissive member includes a first light-transmissive member covering the first light emitting element, a second light-transmissive member covering the second light emitting element, and a third light-transmissive member covering the third light emitting element.

14. The light emitting device according to claim 13, wherein the light-reflective member surrounds a lateral surface of each of the first light-transmissive member, the second light-transmissive member, and the third light-transmissive member.

15. A light emitting device comprising:
   a substrate;
   a plurality of light emitting elements electrically connected on the substrate and each having a light emitting surface;
   a light-transmissive member arranged over the light emitting elements; and
   a light-reflective member covering a lateral surface of the light emitting elements and a lateral surface of the light-transmissive member, wherein
      the plurality of light emitting elements include a plurality of first light emitting elements and a second light emitting element that has smaller area of the light emitting surface than that of each of the first light emitting elements, and
      the second light emitting element is arranged between the first light emitting elements.

16. The light emitting device according to claim 15, wherein a current density of the second light emitting element is higher than that of each of the first light emitting elements.

* * * * *